United States Patent

Fan et al.

Patent Number: 5,882,984
Date of Patent: Mar. 16, 1999

[54] METHOD FOR INCREASING THE REFRESH TIME OF THE DRAM

[75] Inventors: Der-Tsyr Fan; Chon-Shin Jou; Ting S. Wang, all of Hsinchu, Taiwan

[73] Assignee: Mosel Vitelic Inc., Taiwan

[21] Appl. No.: 728,305

[22] Filed: Oct. 9, 1996

[51] Int. Cl.⁶ .................................................. H01L 21/76
[52] U.S. Cl. ................................... 438/440; 438/407
[58] Field of Search .................... 438/423–427, 438/404–407, 439–442

[56] References Cited

U.S. PATENT DOCUMENTS 5,019,526  5/1991  Yamane et al. .
5,338,691  8/1994  Enomoto et al. .
5,372,951  12/1994  Anjum et al. .
5,496,754  3/1996  Bergemont et al. .
5,614,421  3/1997  Yang .
5,672,539  9/1997  Thakur et al. .

*Primary Examiner*—Jey Tsai
*Attorney, Agent, or Firm*—Hayes, Soloway, Hennessey, Grossman & Hage, P.C.

[57] ABSTRACT

The present invention is a method for increasing the refresh time of DRAM. This invention is for decreasing the stress between the bird's beak of field oxide and silicon substrate by using fluorine ion implant before field oxidation and the optimal structure of LOCOS to effectively preventing the current leakage from the bird's beak of field oxide. Therefore, this invention can increase the refresh time of DRAM and greatly enhance the performance in DRAM.

19 Claims, 3 Drawing Sheets

5,882,984

METHOD FOR INCREASING THE REFRESH TIME OF THE DRAM

FIELD OF THE INVENTION

The present invention relates to the processes for manufacturing the DRAM and, more particularly, to a method of increasing the refresh time of the DRAM.

BACKGROUND OF THE INVENTION

Generally, in the DRAM processes, the technology of field oxide isolation is used to form the LOCOS structure (as shown in FIG. 1) on a substrate. FIG. 1 shows a cross-sectional view of a stage in the conventional fabrication of the LOCOS structure. A field oxide layer 12 is formed on a substrate 10 and a pad oxide layer 13 is formed between the field oxide layer 12 on the substrate 10. The field oxide layer is a silicon oxide layer. There is the stress existing between the edge of the field oxide layer and the substrate. The smaller IC scale the more stress. This stress is generated from the different size of silicon lattices and silicon oxide lattices. Furthermore, after forming the field oxide layer, the sequential step is a etchback step. The etchback step is to remove the pad oxide layer and bird's beak and to define the active area. FIG. 2 shows a cross-sectional view of completing the etchback step in the conventional fabrication of the LOCOS structure. This etchback step is done by a wet etching process with 10% HF solution. Usually, the wet etching process has an over-etching to ensure removal of bird's beak. This results in the field oxide edge with the steep angle of about eighty to ninety degrees. The steep angle will make the stress on the bird's beak stronger, indicated by arrows 27. The stronger stress on the bird's beak, the easier to appear the dislocation phenomenon on the substrate. Moreover, the stress will cause the stress-induced defect in LOCOS structure, indicated by an arrow 28, because the sequent processes, such as the plasma etching or the ion implantation, damage the lattice resulted in releasing the energy of the lattice when the heating process. This defect, indicated by an arrow 28, will cause the current leakage from the junction of memory cell in the DRAM. The total leakage current of the cell must be low enough that the cell does not discharge and lose its memory state between refreshes. Thus, the refresh time of the DRAM will reduce or the retentive memory of the DRAM will discharge resulted from the current leakage. It makes the performance of the DRAM worse.

In addition, the stress of the field oxide edge will retard the next step, the gate oxide layer growing, so as to further lead to the gate-oxide-thinning effect. The gate-oxide-thinning effect is that the gate oxide layer can not grow on the bird's beak of field oxide layer as shown in FIG. 3. This thinning occurs even after a sacrificial oxide process, due to the large oxide stress. From the FIG. 3, a field oxide layer 12 is formed on the substrate 10 and then a gate oxide layer 13 is formed on the field oxide layer 12. The phenomenon of the thinning effect is indicated by the arrow 29. This field-oxide-thinning effect can produce the problem with respect to field-edge leakage. Finally, it also results in shortening the refresh time of the DRAM and makes the performance of the DRAM worse.

SUMMARY OF THE INVENTION

In accordance with the present invention, a method of increasing the refresh time of DRAM is provided. In one embodiment, the method comprises the main steps as following: (1) forming a pad oxide layer on a substrate; (2) forming a silicon nitride layer on the pad oxide layer; (3) implanting ions in the pad oxide layer, wherein the silicon nitride layer serves as a mask; (4) forming a field oxide layer on the substrate, wherein the silicon nitride layer serves as a mask; (5) removing the silicon nitride layer; (6) removing the pad oxide layer; and finally (7) removing partial of the field oxide layer to optimize the angle between the field oxide layer and the substrate.

The method of the present invention provides the approaches to solve the problems with the memory discharge and the shorter refresh time of the DRAM. This approach is to implant a reasonable dosage of fluorine ions before forming the field oxide layer in order to reduce the stress of the bird's beak of the field oxide. The fluorine ions will gather together on the interface between oxide layer and silicon, particularly under the bird's beak with the strongest stress. The fluorine ions can incorporate in the interface between oxide layer and silicon and relive the stress of the interface. Moreover, the another approach is to optimize the field oxide structure to effectively reduce the stress of bird's beak. The approach is completed by the two separated etching processes. First, using the precisive etching process, such as a wet etching process or a dry etching process, etches the pad oxide layer. Second, according to the different field-oxide technology or the different length of bird's beak, adding little wet precisive etching process etches the field oxide layer in order to get the optimizative isolation curve of field oxide. This significantly reduces the excessive stress resulted from conventional over-etching process. The optimizative field oxide structure means the bird's beak with an angle of about thirty degrees to forty five degrees between field oxide layer and silicon substrate. Thus, this present invention will overcome the problem of the current leakage to improve the refresh time of the DRAM and the performance of DRAM.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The method of increasing the refresh time of the DRAM described herein includes some process procedures that are well known in the art of semiconductor integrated circuit fabrication and, thus, need not be described in detail. For example, the various photolithography and etching processes for patterning a layer are very well known and, thereof, the various steps of these processes are omitted.

Figure 1:
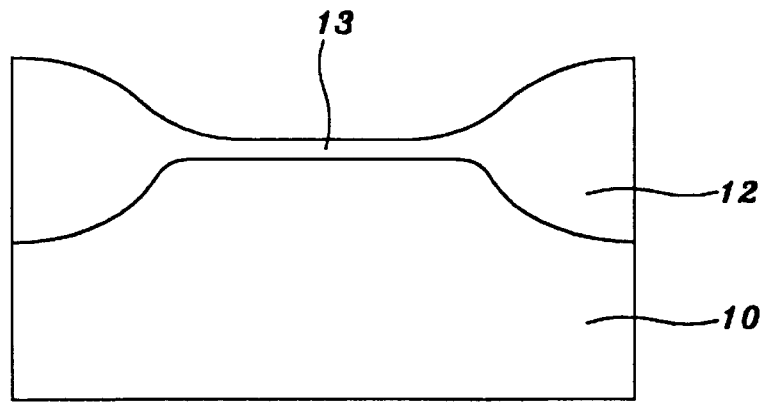
FIG. 1 shows a cross-sectional view of a stage in the conventional fabrication of the LOCOS structure.
Figure 2:
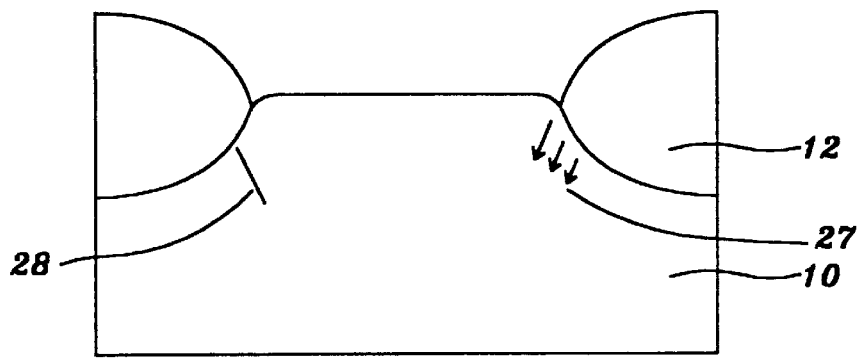
FIG. 2 shows a cross-sectional view of completing the etchback step in the conventional fabrication of the LOCOS structure.
Figure 3:
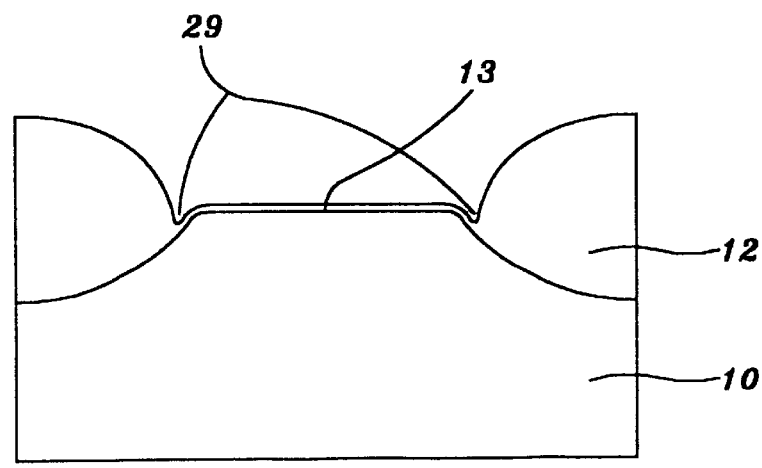
FIG. 3 shows a cross-sectional view of forming the gate oxide layer happened the thinning effect in the conventional fabrication of the LOCOS structure.
Figure 4:
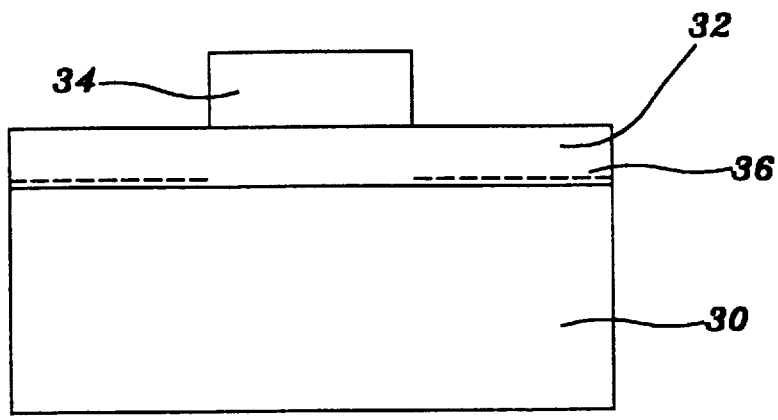
FIGS. 4–8 are cross-sectional views of a semiconductor wafer illustrating various stages of forming the LOCOS structure according to one embodiment of the present invention.

In accordance with one embodiment of the present invention, the structure shown in FIG. 4 is formed using any suitable process. The pad oxide layer 32 is formed on a substrate 30. Typically, the pad oxide layer 32 is a silicon oxide layer and has the thickness of about 300–500 Å. Next, a silicon nitride layer 34 is formed on the pad oxide layer 32 and then to pattern the silicon nitride layer 34. The silicon nitride layer 34 with a thickness of about 1500–2500 Å serves as the mask for the sequential step to define the active area. The thicknesses of pad oxide 32 and nitride 34 are chosen so that a certain enchroachment, during field oxidation, is allowed. The sequential step is to implant ions into the pad oxide layer 32. In this step, the silicon nitride layer 34 serves as the mask of implantation. The step of ion implantation is done by implanting fluorine ions having a dosage of about $1 \times 10^{14}$–$1 \times 10^{15}$ ions/cm$^2$ in the bottom of the pad oxide layer 32, indicated by the arrow 36.

Figure 5:
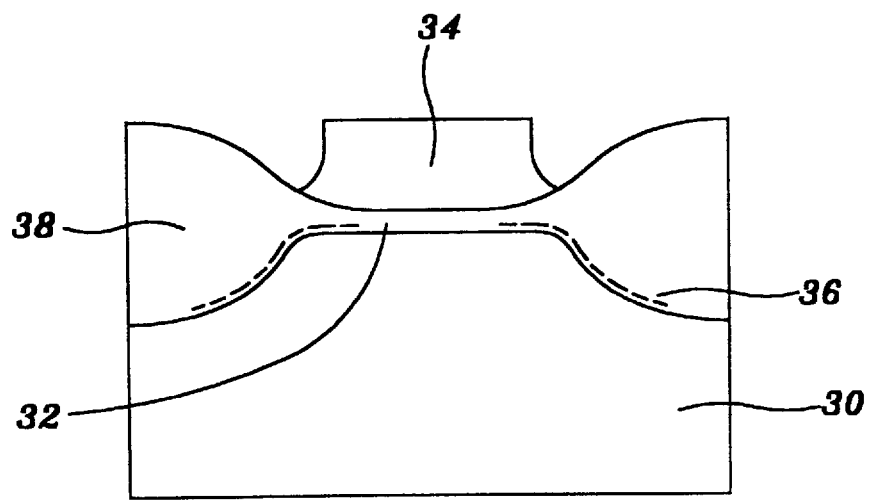

Turing to FIG. 5, the field oxide layer 38 is formed on the a substrate 30. In this step, the silicon nitride layer 34 serves as the hard mask. From the FIG. 5, the field oxide 38 closing to the silicon nitride layer 34 is formed the peak (usually called bird's beak) and the implanted fluorine ions will be scattered on the interface between the silicon substrate 30 and the bird's beak of the field oxide 38, particularly under the bird's beak with the strongest stress. The fluorine ions can strengthen the bonding force between silicon lattices and continuously fix the stress of the interface to endue the larger stress. The fluorine ions can incorporate in the interface between oxide layer and silicon and relive the stress of the interface. The step of forming the field oxide layer is done by using the wet oxidation. The field oxide layer 38 is typically a silicon oxide layer.

Figure 6:
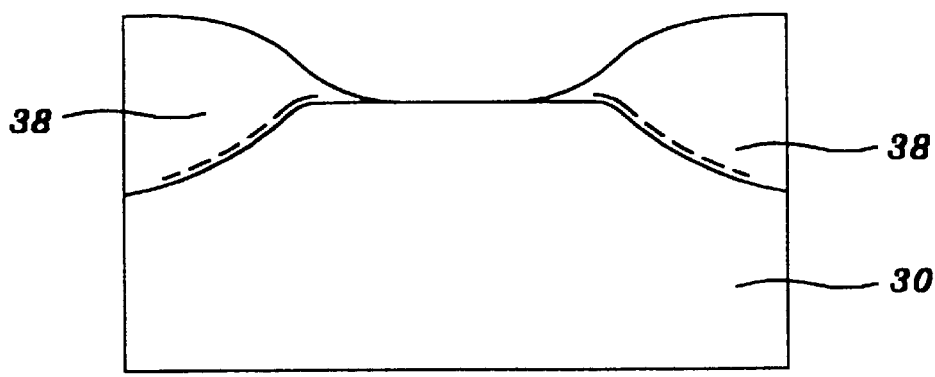
Figure 7:
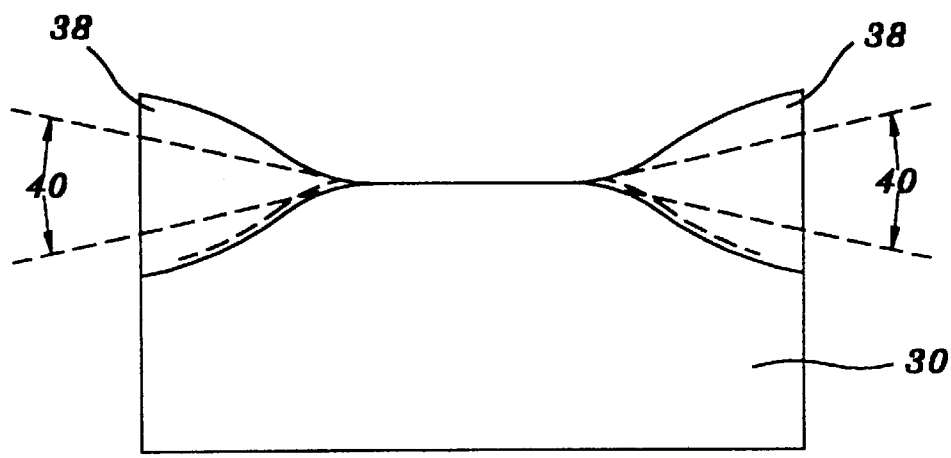

FIG. 6 shows the cross-sectional views of a semiconductor wafer illustrating third stages of forming the LOCOS structure according to one embodiment of the present invention. First, using wet etching process removes the silicon nitride layer 34 and then the pad oxide layer 32 is removed by using the precisive etching process (within 10%deviation) to form the field oxide layer 38 with the bird's beak having a smooth angle on the substrate 30. This duplicate the surface profile of field oxide. The step of removing the pad oxide layer 32 can be done by the fluorocarbon containing plasma etching process. Particularly, the etching is an end-point mode process which automatically stops on the surface of the substrate 30. The fluorocarbon containing plasma usually comprises the CF$_4$, C$_2$F$_6$, and CHF$_3$ vapor. Alternatively, The step of removing the pad oxide layer 32 can be done by the wet etching process with using lower than 1% HF solution. Generally, the step of removing the pad oxide layer in the conventional method is etched by the wet etching process with using 10% HF solution, so it is not easy to control the etching condition. Comparing to the conventional process, this step using lower than 1% HF solution in the invention process is to dilute the concentration of the HF solution as less than one ten times of the 10% HF solution in conventional process. This means that the etching rate in the invention process is also slown down less than one ten times of the original etching rate in the conventional process. Therefore, the etching rate is easier to control the etching condition in order to avoid to unduplicate the curve of the field oxide layer 38 and to result in the bird's beak with the steep angle of about eighty to ninety degrees. This is helpful to alleviate the problem of the stress. The end-point mode plasma etching process is also easy to control the etching condition and etching stop, and can provide a precise etching process to avoid the problem of the stress worse.

Figure 8:
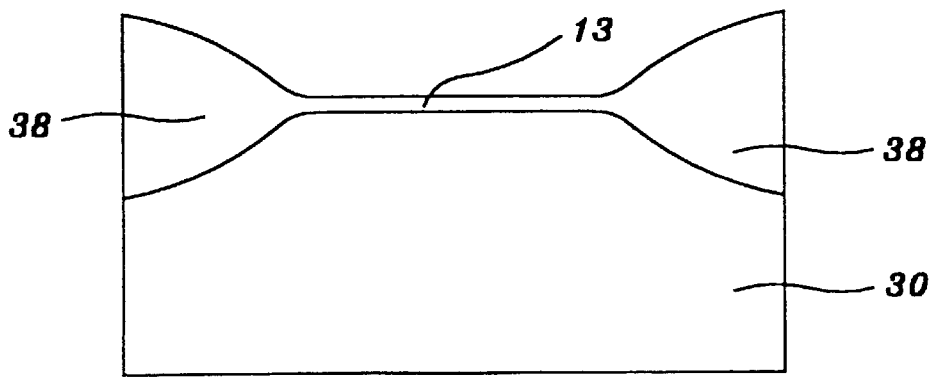

Finally, the partial of the field oxide layer 38 is precisely removed to optimize the angle between the edge of field oxide layer 38 and silicon substrate 30. This forms a smooth field oxide edge angle which dissipates the field oxide stress. According to the experiment data, the current leakage has a minimum value when the angle between the field oxide layer 38 and silicon substrate 30 is reached about thirty to forty-five degrees. Thus, this step of removing the partial of the field oxide layer 38 is done by the same as the late step of the wet etching process ( the wet etching process with using lower than 1% HF solution) to etching the partial of the field oxide layer 38 to make the angle of between the field oxide layer 38 and silicon substrate 30 with a degree of about thirty to forty-five degrees as the result of achieving the optimizative curve of field oxide isolation. In this condition, the stress around in the bird's beak will reduce largely. The stress-induced dislocation and the subsequent gate oxide thinning can be also suppressed as shown in FIG. 8. This has been proven to largely decrease the current leakage and increase the refresh time of the DRAM.

The method of this invention utilizes the fluorine implantation before the field oxide layer formed and the optimizative etchback process to effectively strengthen the interface between the silicon and the silicon oxide, reduce the stress-induced defects, and eliminate the oxide thinning effect. This can increase the refresh time of DRAM and greatly enhance the performance in DRAM. According to the experiment data, the products produced by the invention processes, the current leakage has been improved about 70% and the average of refresh time has been increased 30%.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method for increasing the refresh time of a DRAM, said method comprising the steps in sequence of:

forming a pad oxide layer on a substrate;

forming a silicon nitride layer on a portion of said pad oxide layer;

implanting fluorine ions, only in said pad oxide layer, wherein said silicon nitride layer serves as a mask;

forming a field oxide layer on said substrate, wherein said silicon nitride layer serves as a mask;

removing said silicon nitride layer;

removing said pad oxide layer; then partially removing said field oxide layer to optimize the angle between said field oxide layer and said substrate.

2. The method according to claim 1, wherein said pad oxide layer comprises a silicon oxide layer.

3. The method according to claim 1, wherein said pad oxide layer comprises a pad oxide layer having a thickness of about 300–500 Å.

4. The method according to claim 1, wherein said fluorine ions comprise fluorine ions having a dosage of about $1 \times 10^{14}$–$1 \times 10^{15}$ ions/cm$^2$.

5. The method according to claim 1, wherein said field oxide layer comprises a silicon oxide layer.

6. The method according to claim 1, wherein said silicon nitride layer is removed by wet etching.

7. The method according to claim 1, wherein said pad oxide layer is removed by end-point mode dry etching.

8. The method according to claim 1, wherein said pad oxide layer is removed by wet etching.

9. The method according to claim 8, wherein said wet etching is performed using lower than 1% HF solution.

10. The method according to claim 7, wherein said end-point mode dry etching is performed using a fluorocarbon containing plasma.

11. The method according to claim 10, wherein said plasma comprises a fluorocarbon selected from the group consisting of $CF_4$, $C_2F_6$, $CHF_3$ vapor.

12. The method according to claim 1, wherein said particles removing of said field oxide layer is by wet etching.

13. The method according to claim 12, wherein said wet etching is performed using lower than 1% HF solution.

14. The method according to claim 1, wherein said angle between said field oxide layer and said substrate comprises an angle having a degree of about 30°–45°.

15. A method for increasing the refresh time of a DRAM, said method comprising the steps in sequence of:

forming a pad oxide layer on a substrate, wherein said pad oxide layer comprises a silicon oxide layer;

forming a silicon nitride layer on a portion of said pad oxide layer;

implanting fluorine ions, only in said pad oxide layer, wherein said silicon nitride layer serves as a mask;

forming a field oxide layer on said substrate, wherein said silicon nitride layer serves as a mask, wherein said field oxide layer comprises a silicon oxide layer;

removing said silicon nitride layer by wet etching;

etching said pad oxide layer; then partially etching the tip of said field oxide layer to optimize the angle between said field oxide layer and said substrate, wherein the degree of said angle is about 30–45 degree.

16. The method according to claim 15, wherein said fluorine ions comprise fluorine ions having a dosage of about $1\times10^{14}$–$1\times10^{15}$ ions/cm$^2$.

17. The method according to claim 15, wherein said pad oxide layer is etched by wet etching with lower than 1% HF solution.

18. The method according to claim 15, wherein etching said pad oxide layer is etched by end-point mode etching using a fluorocarbon containing plasma selected from the group consisting of $CF_4$, $C_2F_6$, and $CHF_3$ vapor.

19. The method according to claim 15, wherein said partially etching the tip of said field oxide layer is by wet etching with lower than 1% HF solution.

* * * * *